US010168382B2

(12) United States Patent
Hodges et al.

(10) Patent No.: US 10,168,382 B2
(45) Date of Patent: Jan. 1, 2019

(54) SENSITIVE, DANGEROUS, VULNERABLE, OR EXPENDABLE INSTALLED EQUIPMENT ITEM(S) SAFE PROGRAMMABLE AND EXPANDABLE RESOURCE ELECTRONIC TEST EQUIPMENT APPARATUSES AND RELATED METHODS FOR TESTING AND INTERFACING WITH MULTIPLE CLASSES OR TYPES OF SYSTEMS UNDER TEST WITH OR WITHOUT THE SENSITIVE, DANGEROUS, VULNERABLE, OR EXPENDABLE ITEM(S) INSTALLED

(71) Applicant: The United States of America as represented by the Secretary of the Navy, Washington, DC (US)

(72) Inventors: Eric Hodges, Simi Valley, CA (US); Ernest Coates, Ventura, CA (US); Angel Rosales-Ayala, Oxnard, CA (US); Masato Taniguchi, Camarillo, CA (US); Justin Cheung, Camarillo, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 24 days.

(21) Appl. No.: 15/232,756

(22) Filed: Aug. 9, 2016

(65) Prior Publication Data
US 2017/0038420 A1 Feb. 9, 2017

Related U.S. Application Data

(60) Provisional application No. 62/202,863, filed on Aug. 9, 2015.

(51) Int. Cl.
*G01R 31/04* (2006.01)
*G01R 31/14* (2006.01)
(Continued)

(52) U.S. Cl.
CPC ........... *G01R 31/28* (2013.01); *G01R 31/021* (2013.01); *G01R 31/04* (2013.01); *G01R 31/041* (2013.01); *G01R 31/14* (2013.01)

(58) Field of Classification Search
CPC ....... G01R 31/041; G01R 31/28; G01R 31/04
(Continued)

(56) References Cited

U.S. PATENT DOCUMENTS

| 7,089,139 | B2 * | 8/2006 | Loh | G01R 31/2834 |
| | | | | 702/117 |
| 2002/0045997 | A1 * | 4/2002 | List | G01R 31/3016 |
| | | | | 702/125 |
| 2010/0079160 | A1 * | 4/2010 | Hernandez | G01R 31/001 |
| | | | | 324/754.27 |

* cited by examiner

*Primary Examiner* — John H Le
(74) *Attorney, Agent, or Firm* — Christopher A. Monsey

(57) ABSTRACT

Electronic test set embodiments and related methods are provided that can include a variety of safety components and/or processes which permit expandable or scalable automated testing of different types of equipment with or without installed sensitive, dangerous, vulnerable or expendable equipment. Embodiments can programmably or interface share measuring systems using expandable programmable interface systems that can scalably test a large number of components or electrical channels or bus lines. Embodiments can include multiple circuit board slot connectors adapted to receive programmable relay circuit cards that can selectively couple individual pins on ETS interface structures (e.g., cable connectors) to selected test equipment. Programmable relay circuit cards can be added to the ETS based on how many channels or bus connections are needed to interface with a system under test.

12 Claims, 14 Drawing Sheets

(51) Int. Cl.
*G01R 31/02* (2006.01)
*G01R 31/28* (2006.01)

(58) Field of Classification Search
USPC .............. 702/58, 117, 125; 324/527, 754.07; 714/736
See application file for complete search history.

SENSITIVE, DANGEROUS, VULNERABLE, OR EXPENDABLE INSTALLED EQUIPMENT ITEM(S) SAFE PROGRAMMABLE AND EXPANDABLE RESOURCE ELECTRONIC TEST EQUIPMENT APPARATUSES AND RELATED METHODS FOR TESTING AND INTERFACING WITH MULTIPLE CLASSES OR TYPES OF SYSTEMS UNDER TEST WITH OR WITHOUT THE SENSITIVE, DANGEROUS, VULNERABLE, OR EXPENDABLE ITEM(S) INSTALLED

CROSS-REFERENCE TO RELATED APPLICATIONS

The present application claims priority to U.S. Provisional Patent Application Ser. No. 62/202,863, filed Aug. 9, 2015, entitled "EXPANDABLE RESOURCE ELECTRONIC TEST EQUIPMENT APPARATUSES AND RELATED METHODS," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,271) is assigned to the United States Government and is available for licensing for commercial purposes. Licensing and technical inquiries may be directed to the Technology Transfer Office, Naval Surface Warfare Center PHD.

BACKGROUND AND SUMMARY OF THE INVENTION

A need exists in the prior art for systems and related methods associated with providing a sensitive, dangerous, vulnerable or expandable installed equipment safe electronic test system (ETS) having a capability of measuring a variety of different systems under test. Exemplary ETS can be designed having multiple categories of common ETS interface structure variants or configurations that couple systems under test including or not including installed sensitive, dangerous, vulnerable or expandable installed equipment (e.g., explosive or combustible elements). ETS electrical interface structure embodiments can be provided such as system under test cables or wiring bus systems (e.g., ribbon cable) that are terminated with different systems under electrical interface structures (e.g., cannon plugs, electrical connectors, block connectors or bus interfaces, etc.) that have safety components built in. Embodiments can include a chassis having multiple circuit board slot connectors adapted to receive programmable relay circuit cards that can selectively couple individual pins on common ETS interface structures to selected test equipment. The ETS can receive multiple programmable relay circuit cards which can be increased in number based on how many channels or bus connections are needed to interface with a system under test. Embodiments can scale to interface with a scalably high number of components or interface control channels while using a common or limited number of measuring instruments that are safe for use when such explosive or combustible system elements are installed. Such a desired system can include an ability to provide a low-resistance, controlled impedance path between any selected measuring instrument and the system or unit under test as well as an ability to have an installed explosive or combustible element safe interfacing system. A desired system can also have an automated reconfigurable or programmable interfacing system and be automated to run a variety of tests.

Because a unit under test may be faulty, a system is desired to analyze any combination of faults against incorrect voltages and shorts with a wide variety of connection variables, system types, connector types, etc. which reduce the need for different test sets and connectors or other elements of the test system. Detected faults can be presented to the user, and a pass/fail label given to the unit under test after the test completes.

An exemplary embodiment of the present disclosure provides a unique measuring system that can effectively analyze errors in a unit and its subsystems under test, using limited measuring instruments. Accordingly, in one embodiment, the present disclosure provides for an expandable ETS that can route a number of input and outputs to a set of common or limited measuring instrument(s) to any combination of test channels in an explosive safe manner. In accordance with some forms of the disclosure, such a monitoring system is capable of analyzing and storing errors alongside identifying information regarding the unit under test.

In particular, embodiments of the invention can have common ETS interface types for at least two configuration categories of exemplary common electronic test equipment interface structures (CETSIS) for each system under test. A first configuration category of CETSIS can be an installed explosive or combustible element safe (IECES) configuration and a second configuration category of CETSIS can be a non-installed explosive or combustive element safe (NIECES) configuration. The first configuration category can be an IECES CETSIS configuration that includes multiple safety structures such as a CETSIS formed without an electrical interface with a corresponding pin or electrical interface in a specific position of the CETSIS to prevent a voltage signal from passing between a system under test's cable or wire coupled to the ETS' IECES CETSIS. Alternatively, the cable or wire connecting to the system under test having the explosive or combustible element can be formed with the missing electrical connector associated with CETSIS structures with applied power or voltage signals where the cable is marked as a cable used when explosives or combustible elements are being tested (e.g., red danger tag or flag, markings, etc.). The cable used with systems having installed explosives or combustibles can also include a loop back with a resistor installed on wires or channels where power could be applied to an operational system which could trigger the explosive or combustible elements.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

Figure 1:
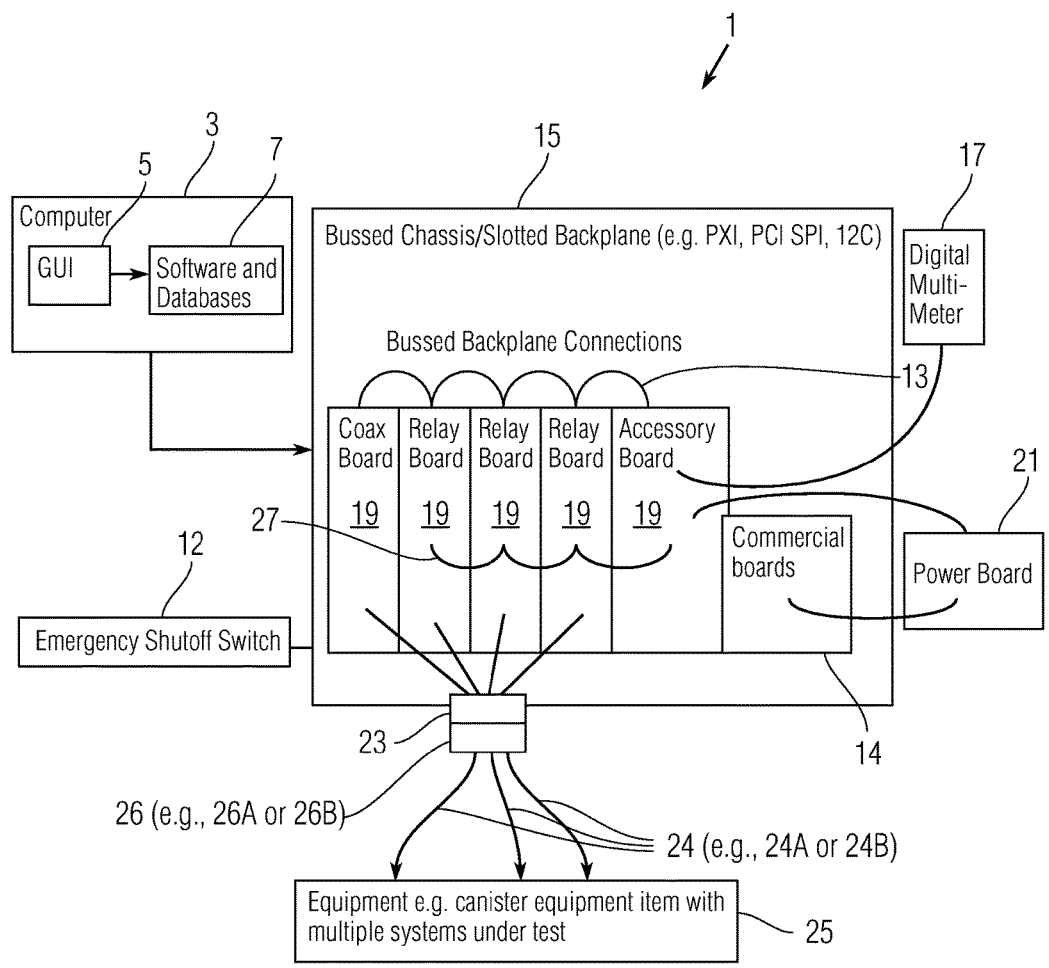
FIG. 1 is a diagram of an exemplary ETS embodiment.

The embodiments of the invention described herein are not intended to be exhaustive or to limit the invention to precise forms disclosed. Rather, the embodiments selected for description have been chosen to enable one skilled in the art to practice the invention.

The present invention relates to various embodiments and methods of designing, making, and using a variety of test sets that allow for the sharing of limited instruments across a large number of channels for systems with and without explosive or combustible elements installed. Generally, an exemplary ETS can include a relay circuit card assembly with reprogrammable signal relay matrix controlled by a test control computer system or preset/previously loaded multiplexer settings on the relay circuit cards (e.g., loaded on a field programmable gate array that controls the relay matrix) and communicates with a computer over a shared bus and has another set of connections with instruments and the unit under test which provides an expandable secondary control signal network arrangement with multiple elements and cross connections between relay card assemblies (e.g., FIG. 1, 27). For example, a test set chassis can be provided with a common motherboard with a bus system that includes a set of circuit card insertion bus slots (e.g., PXI bus with card slots). A number of relay card assemblies can be provided which insert into the circuit card insertion bus slots. Each exemplary relay card assembly includes a field programmable gate array (FPGA) which is connected to the card insertion bus interface of a respective relay card and also to a programmable relay matrix that has reprogrammable inputs and outputs which can be configured to selectively couple one or more inputs with one or more outputs of the relay matrix. Relay cards also can include one or more input/outputs which are configured to connect with a unit under test or a test instrument used to test the unit under test. A plurality of secondary bus segments (e.g., FIG. 1, 27) can be used to reconfigurably create another bus that passes between the relay card assemblies and individually also connects with each relay matrix input or output so that one or more single wire segments in the plurality of secondary bus segments can be configured to create a programmable electrical path (using the relay matrices) between one test instrument connected to a first relay card and a unit under test connected to another relay card including connections through other relay cards/secondary bus segments (e.g., FIG. 1, 27). In some embodiments, secondary bus segments (e.g., 27) are used to connect relay cards which are in turn programmably connected to an accessory board which is in turn connected with a test instrument. Secondary bus segments (e.g., 27) can be formed using segments of ribbon cables used to respectively daisy chain connect between relay card and their programmable relay matrixes. Embodiments of the invention allow for expansion by adding more relay card assemblies. By wiring shared resources along wires that connect to every relay circuit card assembly, this system can be expanded by adding more relay card assemblies until the addressing limit of the common motherboard or bussed backplane is reached. Sensitive, dangerous, vulnerable, or expendable items safe ETS systems can include a variety of safety structures or systems which provide an ability to perform testing of systems under test with sensitive equipment elements such as combustible, explosive, expendable, or vulnerable equipment element or elements installed or uninstalled. For example, two categories of cable assemblies or bus interface assemblies can be provided where one category of cable assembly or bus interfaces (e.g., a safety interlock cable assembly) connects a system under test with sensitive, dangerous, vulnerable, or expendable items installed to a common interface in the ETS. A second category of cable assembly or bus interfaces (e.g., a non-safety interlock cable assembly) can be used to couple the ETS with a system under test without such sensitive, dangerous, vulnerable, or expendable items. The first or safety interlock cable assembly (e.g., FIG. 1, 24A) can include an ETS common interface electrical connector missing an electrical coupler or pin (male or female) (e.g., FIG. 1, 26A; see also FIG. 10) to isolate one or more conductive lines or channels in the safety interlock cable assembly 24A from the ETS 1 corresponding common interface connector or coupler 23. Such safety interlock electrical isolation can be built into either the first or safety interlock cable assembly (e.g., FIG. 1, 24A) or the cable's common interface connector (e.g., FIG. 1, 26A) with the ETS so as to prevent any electrical signal from being passed from the ETS into the system under test to prevent damage or activation to such sensitive, dangerous, vulnerable, or expendable items of the system under test such as explosive, combustible, consumable, sensitive electronics, or other components which can be damaged or actuated by an accidental or unwanted signal from the ETS. Such a first or safety interlock cable assembly (e.g., 24A) can have markings (e.g., warning, red tag, a differently shaped common connector element, etc.) or a warning streamer which clearly identifies it is being used if the system under test has the sensitive, dangerous, vulnerable, or expendable items installed. The safety interlock cable assembly (e.g., 24A) common interface connector or coupler (e.g., 26A) can further include a loop back and resistor combination for each safety locked out channel or wire in the assembly (e.g., 24A) having the missing electrical connector which loops signals back into the ETS that are then detected by the ETS which then indicates if the correct safety interlock cable has been installed or not as a first processing sequence that is performed before any other testing or ETS operation is executed. Where the sensitive, dangerous, vulnerable, or expendable items are not installed in the system under test, then the second or non-safety interlock cable assembly (e.g., FIG. 1, 24B) will have the missing electrical connector(s) for each cable or bus channel which will be detected as installed due to the missing loop backs and resistors on each channel identified as having risks associated with the sensitive, dangerous, vulnerable, or expendable items.

Referring initially to FIG. 1, exemplary multiple relay circuit cards 19 are inserted into a bussed backplane chassis 15. On the circuit card assembly, a relay circuit card controller 33 can be programmed to listen on the bussed backplane 13 and provide digital outputs to energize relays (e.g., see FIG. 5). Once a controlling computer 3 addresses a specific relay circuit card 19, the exemplary relay circuit card controller interprets commands from the exemplary controlling computer 3. Upon receipt of command from the exemplary controlling computer 3, the exemplary relay circuit card controller activates its digital outputs, energizing specific relays on relay matrix 31 (not shown, but see, e.g., FIG. 5). Activation of relays 31 provides connections between a limited resource 14, 17, 21 (e.g., measuring system(s)) and a discrete cable or bus channel 24 using a pathway provided by a daisy-chained cable 27. One embodiment can include an emergency shut-off switch or system 12 which can rapidly isolate one or more portions of the ETS from power and/or control inputs such as from computer 3 or power supplies (not shown but see, e.g., FIG. 4). Exemplary embodiments of the invention include the first and second category cable assemblies associated with or without safety configuration detection or protection features or capabilities of various embodiments of the invention. For example, such exemplary first and second category of cable assemblies or bus interfaces (e.g., safety interlock cable assembly 24A and the non-safety interlock cable assembly 24B) are adapted to couple with the ETS common interface electrical coupler 23. The exemplary ETS common interface electrical coupler 23 can be provided which couples with one end of the exemplary first or second category of cable assemblies or bus interfaces (e.g., safety interlock cable assembly 24A and the non-safety interlock cable assembly 24B). In at least some embodiments, both categories of cable assemblies or bus interfaces (24A, 24B) include ETS-to-system-under-test cable or interface bus wires or ribbon cables where an opposing end of the ETS-to-system-under test cable or interface bus wires have a system-under-test unique coupler (not shown). In at least some embodiments, the first common interface electrical coupler 23 (or second common interface electrical coupler 26A) can have different pins or elements which are electrically coupled with different elements of the relay circuit card(s) 19. The exemplary first common interface electrical coupler 23 can further be adapted to removeably couple with a second common interface electrical coupler 26 (26A or 26B) that is in turn connected to wires or cables forming such an exemplary ETS-to-system-under-test cable or interface bus wires 24 assembly. The second common interface electrical coupler (e.g., 26A) can include safety structures such as described above (e.g., missing electrical connections for safety critical signal paths that can trigger an unwanted or dangerous reaction in the system under test). Safety verification processes can be included or implemented software or programs 7 stored on a storage medium (or accessed remotely) executed by the computer 3 to determine if the first or second category of cable sets or bus interface assemblies (e.g., 24A, 24B) are connected such as described above. Test programs software 7 can generate graphical user interfaces (GUIs) which are shown on a display system (not shown) to include safety verification processing such as described above when the ETS software 7 determines if such an exemplary first or safety interlock cable assembly (e.g., 24A) is attached to the ETS 1 or not based on detection of loop back and resistor structures in the safety interlock cable assembly's 24A second common interface electrical connector 26A (e.g., see FIG. 10).

Figure 2:
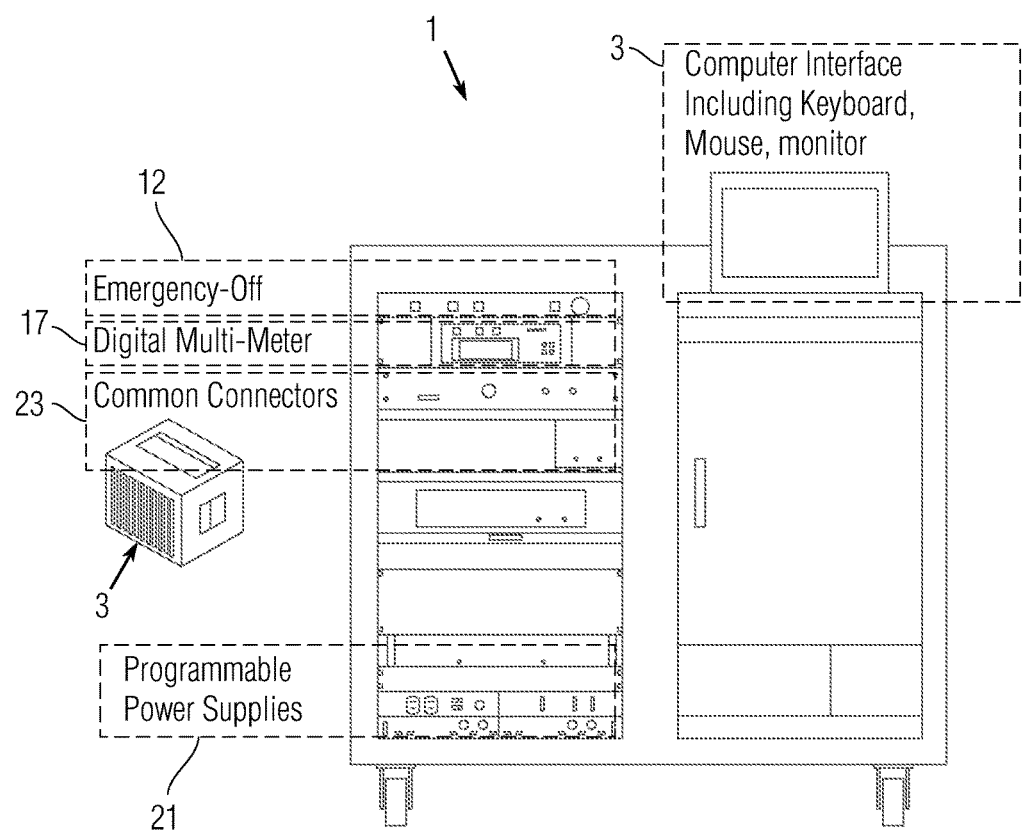
FIG. 2 is a simplified frontal view of an exemplary ETS such as shown in FIG. 1.
Figure 3A:
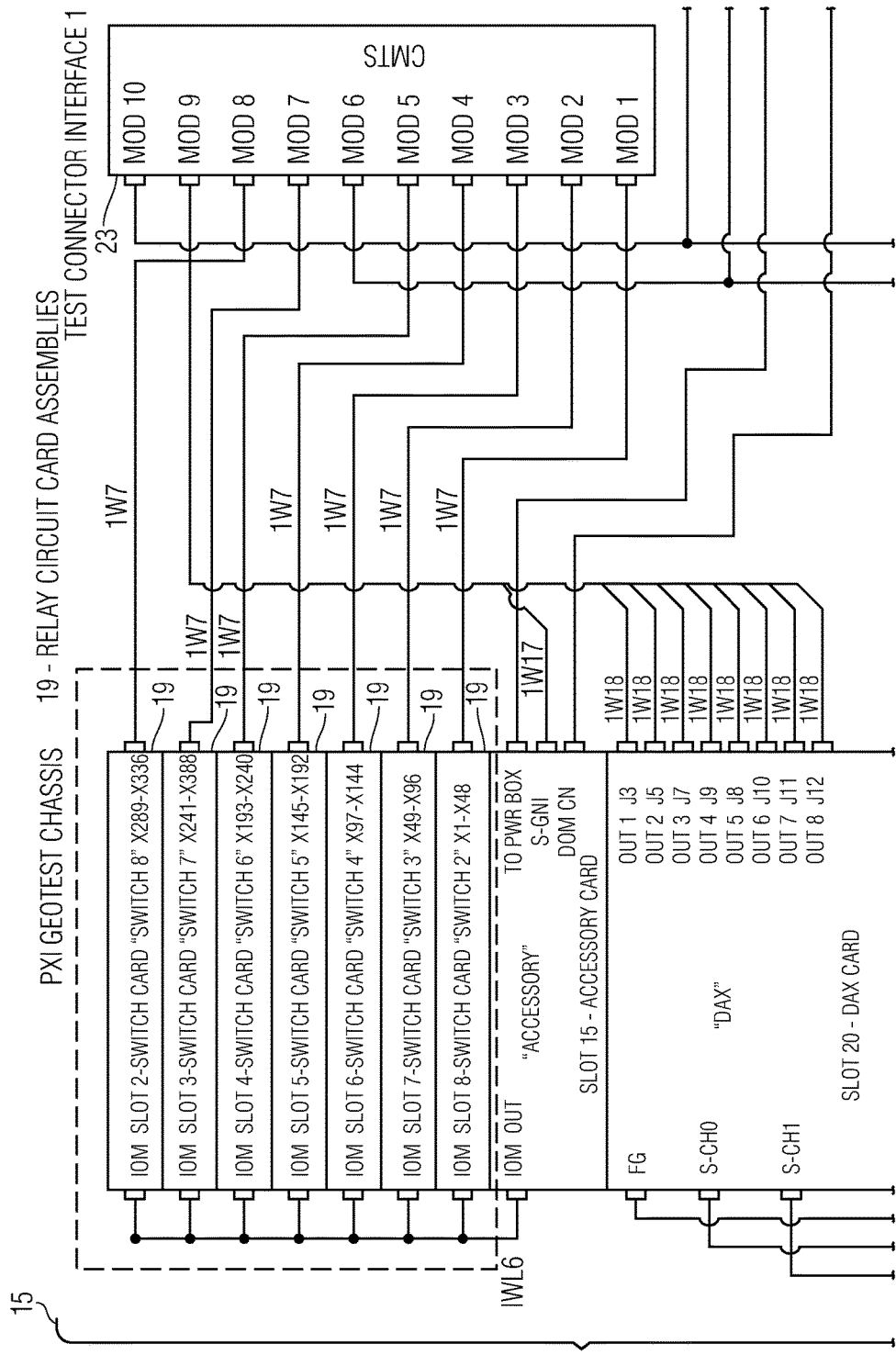
FIG. 3 shows another illustrative example of a top level schematic showing wiring between components of an exemplary implemented ETS such as shown in FIGS. 1-2.
Figure 3B:
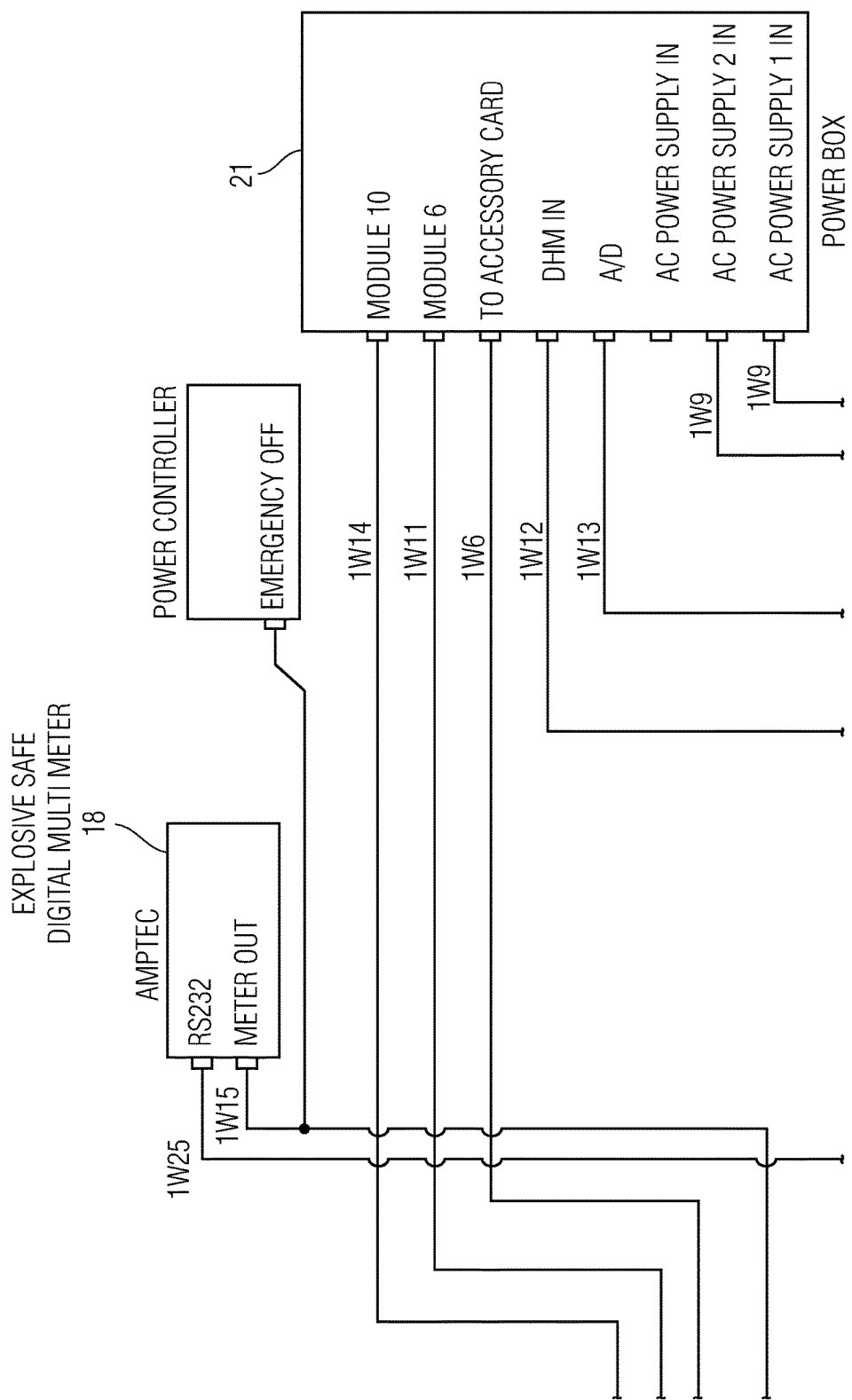
Figure 3C:
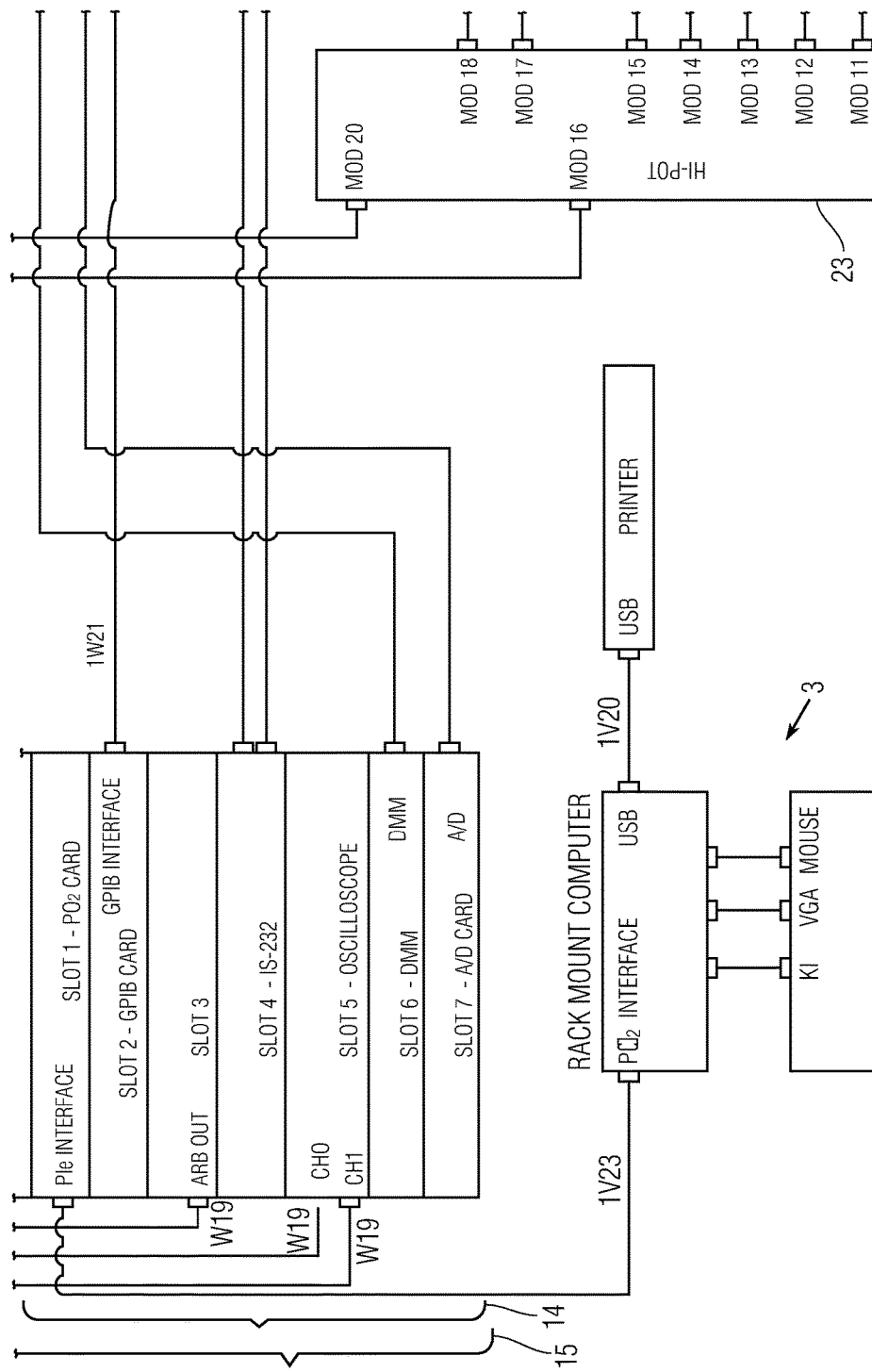
Figure 3D:
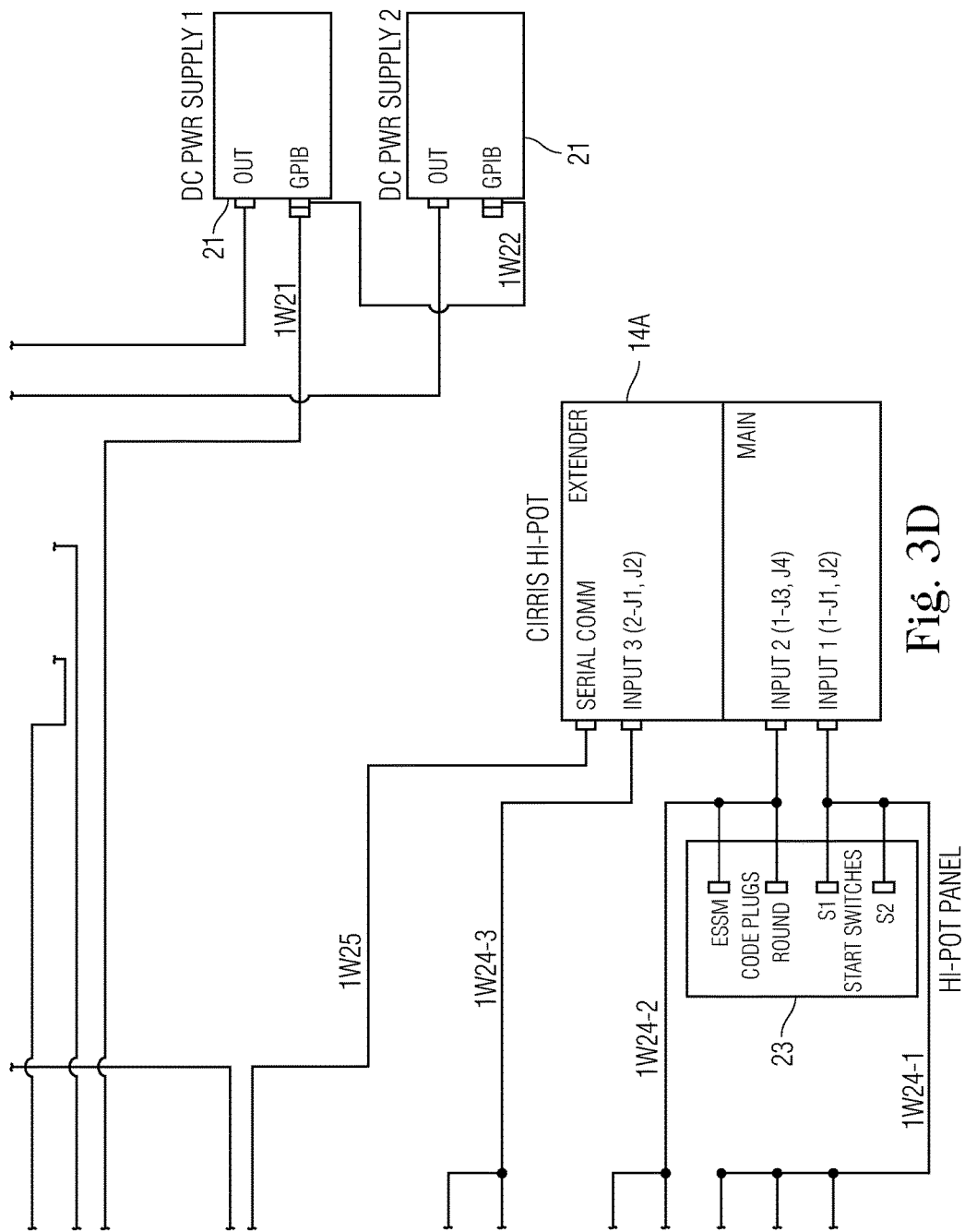

FIG. 2 shows a frontal view of an exemplary test set such as shown in FIG. 1. A user(s) select desired tests via the computer terminal 3. A single ordinance-safe Digital Multimeter 17 can be used. The ETS can further include the emergency shut off system 12, common connection (e.g., 23 to 26A or 26B) that respectively are associated with the first or second category of cable sets or bus interfaces (e.g., safety interlock cable assembly 24A and the non-safety interlock cable set 24B). An embodiment of the invention can include programmable power supplies 21 as well to supply various types of power to the exemplary ETS 1 or system under test.

FIG. 3 shows an illustrative example of a top level schematic showing wiring between components of an exemplary implemented test set such as shown in FIGS. 1 and 2. The controlling computer 3 addresses commercial measurement system(s) 14, 18, 21 or relay circuit cards 19 via the bussed backplane chassis 15 or other forms of communication. Commercial measurement systems can include systems such as a high potential electrical insulation testing system 14A and explosive safe digital multimeter 18. Common interface connector 23 are shown which connect to the first or second category of cable sets or bus interfaces.

Figure 4:
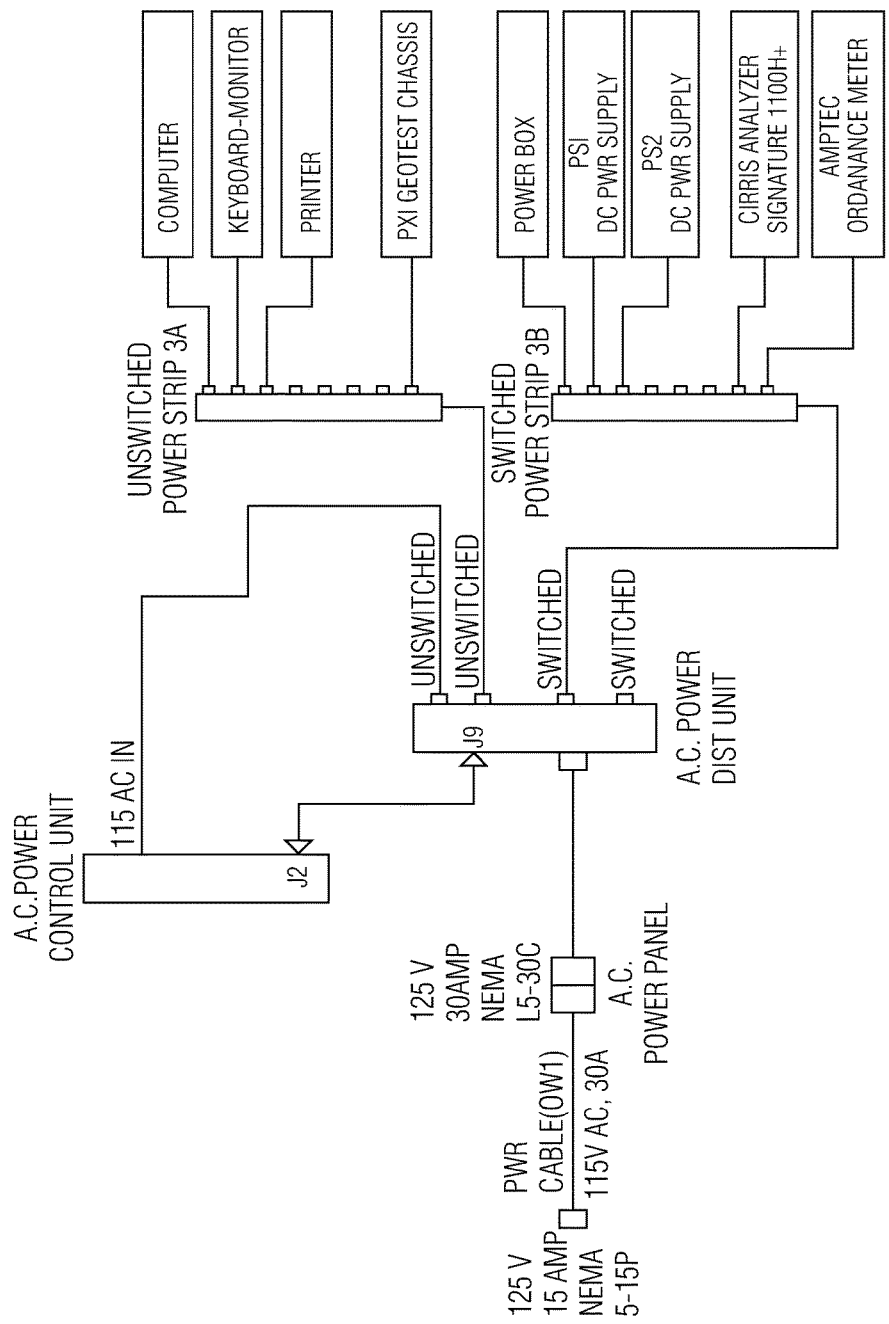
FIG. 4 shows an illustrative example of connections between a power supply and emergency-off unit shown in FIGS. 1-3.

FIG. 4 shows an illustrative example of connections between a power supply and emergency-off unit.

Figure 5:
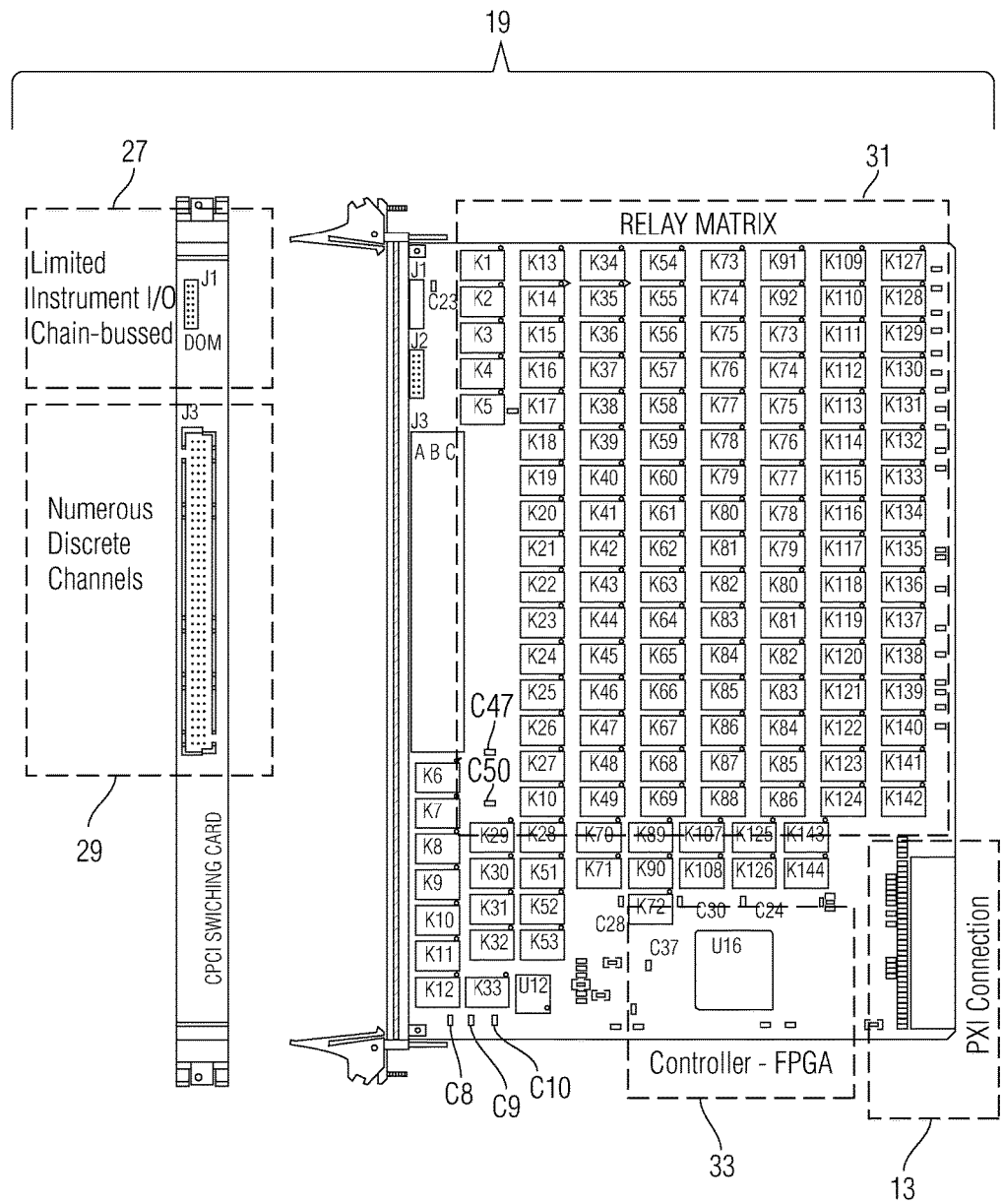
FIG. 5 shows an exemplary block diagram highlighting various components of an exemplary relay card assembly such as shown in FIGS. 1, 3, 6, and 8.

FIG. 5 provides one illustrative example of an implemented design of a relay circuit card 19. This card can use a Xilinx® Spartan 2 FPGA 33 to provide the interface between a PXI connection 13 and the matrix of relays 31. Once energized, the matrix of relays can provide an impedance-controlled electrical connection between the chain-bussed connector 27 and numerous discrete channels 29. This relay circuit card was designed to fit inside a 6U PXI chassis slot. An exemplary PXI chassis (not shown, but see FIG. 1) can allow for numerous circuit cards to be plugged in and individually addressed and controlled.

Figure 6:
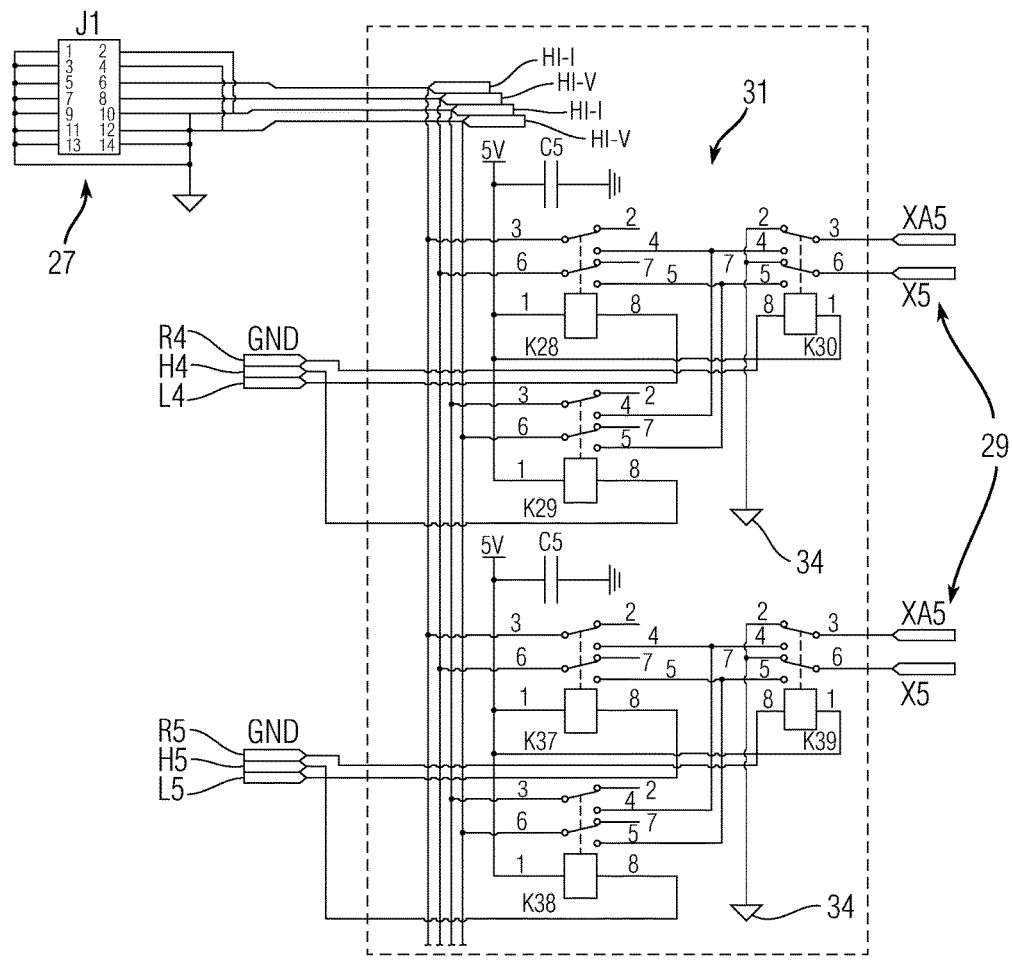
FIG. 6 shows an exemplary relay circuit card schematic.

FIG. 6 shows an exemplary relay circuit card 19 schematic. A measurement system(s) connected to the chain-bussed connector 27 can be connected to numerous discrete channels 29 via the relay matrix 31. The exemplary relay circuit card's relay matrix 31 can be activated by an FPGA or microcontroller (not shown, see FIG. 5). When the relays are not energized, they connect to a common explosive-safe ground 34 that is separate from facility ground, ensuring an electrical disturbance does not damage the sensitive equipment or system under test. In this embodiment, HI-I, LO-I, HI-V and LO-V can be bussed to each relay to share the limited instrument connected to J1 (e.g. DMM, AtoD, Digital I/O, Analog I/O 14). The exemplary relay matrix 31 is expandable, limited only to board space and control lines on the board controller (e.g. FPGA, CPLD, Microcontroller)

Figure 7:
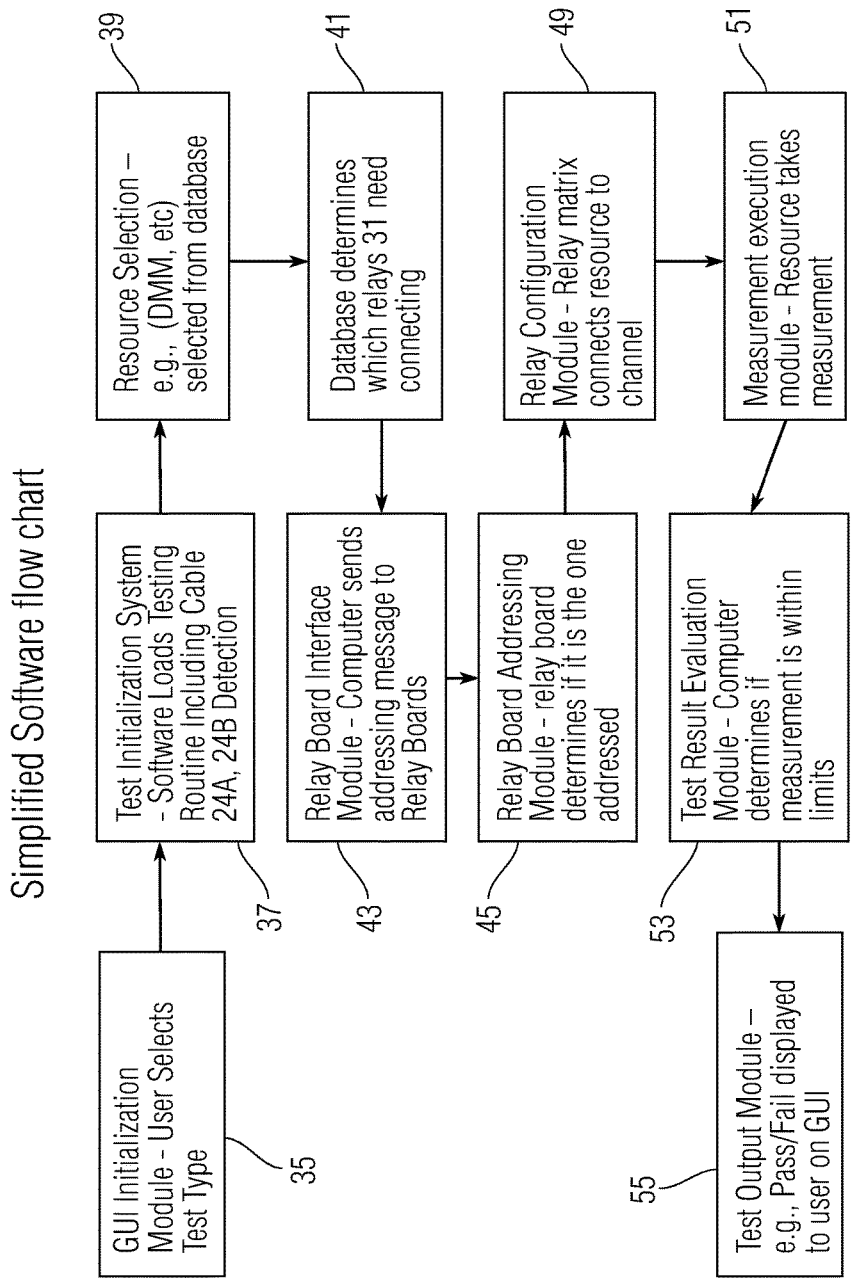
FIG. 7 shows an exemplary simplified software flow chart in accordance with one embodiment of the invention.

FIG. 7 shows an exemplary simplified software flow chart in accordance with one embodiment of the invention. After the user selects the required test 35, a test routine 37 is executed so that the software 7 reads the testing routine 37 from database 7 to commence operations. Included as one of the first checks in the testing routine 37 stored in the database 7 is one or more machine readable instructions to check for the presence of safety interlock structures such as identification resistors and loop back structures in the safety interlock cable assembly 24A (or not present in non-safety interlock assembly 24B). In this embodiment, the database 7 is read to provide machine readable instructions directing ETS elements to determine which resource to select 39 for the specified (e.g., via GUI 5 or software or database 7) test(s) and also includes machine instructions that prevent execution of one or more tests in the software or database 7 which may create danger or risk to equipment such as sensitive, dangerous, vulnerable or expendable installed equipment items or systems if such tests were executed (e.g., detonate a warhead, fire a rocket system propulsion system, operate explosive bolts, generate high energy pulses, operate a hard to access high power chemical battery, short circuit high power electronics, etc.). The exemplary software or database 7 additionally can include a relay connection determination module 41 that reads the database or software 7 to determine how the relay matrix 31 should be energized to connect selected or designated (e.g., via program or by a user in GUI 5) ETS resources used with regard to the system or unit under test. A relay board interface module 43 operates the computer 3 to determine which relay circuit cards 19 will interface and operate with measurement systems (e.g., 14) to perform the measurement and sends a message to individual relay circuit cards 19 with information on which relays to energize. A relay board addressing system 45 then determines if a particular relay board 19 is addressed then a relay matrix configuration module 49 that then connects testing resources to a particular channel or bus line where the exemplary relay circuit card reads the data sent by the computer 3 and energizes specific relays 31 on the board 19. A measurement execution module 51 then executes per direction of the computer 3. A test result evaluation module 53 then determines if measurements are within specified limits (the user can specify via GUI in the GUI initialization module or via a stored program or stored test process stored in, e.g., the database 7). A test output module 55 then outputs test results (e.g. pass/fail) to a user via an output system such as a display showing GUI 5.

Figure 8:
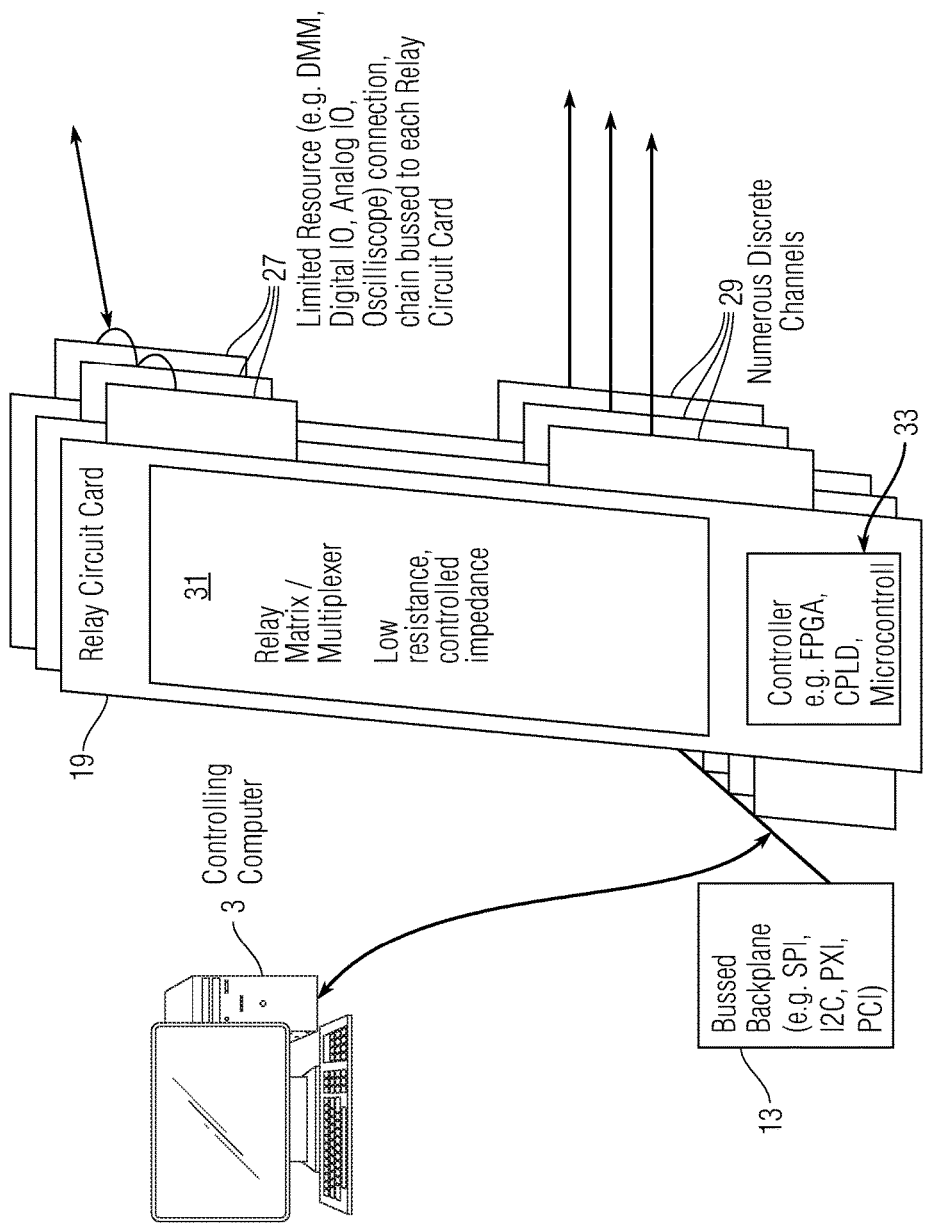
FIG. 8 shows another simplified perspective view of an exemplary a relay circuit card daisy chained to multiple other relay circuit cards and connected to a common motherboard (e.g., bussed backplane)

FIG. 8 shows a different perspective of the exemplary a relay circuit card daisy chained to multiple other relay circuit cards and connected to a common motherboard (e.g., bussed backplane) shown in FIGS. 1-3, 5 etc. herein. In particular, secondary bus 27 is more clearly shown connecting different relay circuit cards 19.

Figure 9:
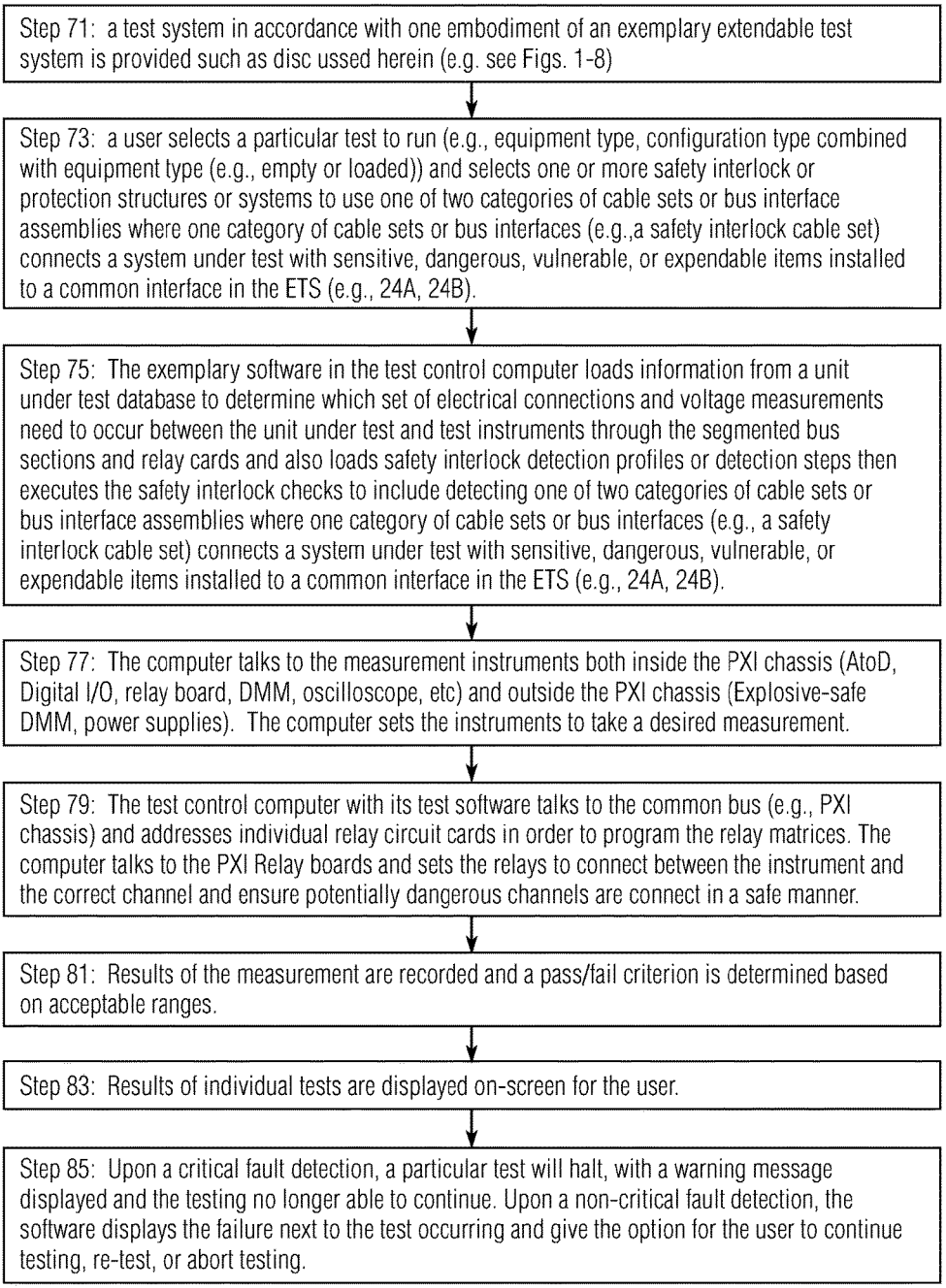
FIG. 9 shows an exemplary method in accordance with one embodiment of the invention.

FIG. 9 shows an exemplary method in accordance with one embodiment of the invention. Step 71: a test system in accordance with one embodiment of an exemplary extendable test system is provided such as discussed herein (see FIGS. 1-8). Step 73: a user selects a particular test to run (e.g., equipment type, configuration type combined with equipment type (e.g., empty or loaded)) and selects one or more safety interlock or protection structures or systems to use one of two categories of cable sets or bus interface assemblies where one category of cable sets or bus interfaces (e.g., a safety interlock cable set) connects a system under test with sensitive, dangerous, vulnerable, or expendable items installed to a common interface in the ETS (e.g., 24A, 24B). Step 75: The exemplary software in the test control computer loads information from a unit under test database to determine which set of electrical connections and voltage measurements need to occur between the unit under test and test instruments through the segmented bus sections and relay cards and also loads safety interlock detection profiles or detection steps then executes the safety interlock checks to include detecting one of two categories of cable sets or bus interface assemblies where one category of cable sets or bus interfaces (e.g., a safety interlock cable set) connects a system under test with sensitive, dangerous, vulnerable, or expendable items installed to a common interface in the ETS (e.g., 24A, 24B). Step 77: The computer talks to the measurement instruments both inside the PXI chassis (AtoD, Digital I/O, relay board, DMM, oscilloscope, etc.) and outside the PXI chassis (Explosive-safe DMM, power supplies). The computer sets the instruments to take a desired measurement. Step 79: The test control computer with its test software talks to the common bus (e.g., PXI chassis) and addresses individual relay circuit cards in order to program the relay matrices. The computer talks to the PXI Relay boards and sets the relays to connect between the instrument and the correct channel and ensure potentially dangerous channels are connected in a safe manner. Step 81: Results of the measurement are recorded and a pass/fail criterion is determined based on acceptable ranges. Step 83: Results of individual tests are displayed on-screen for the user. Step 85: Upon a critical fault detection, a particular test will halt, with a warning message displayed and the testing no longer able to continue. Upon a non-critical fault detection, the software displays the failure next to the test occurring and give the option for the user to continue testing, re-test, or abort testing.

Figure 10:
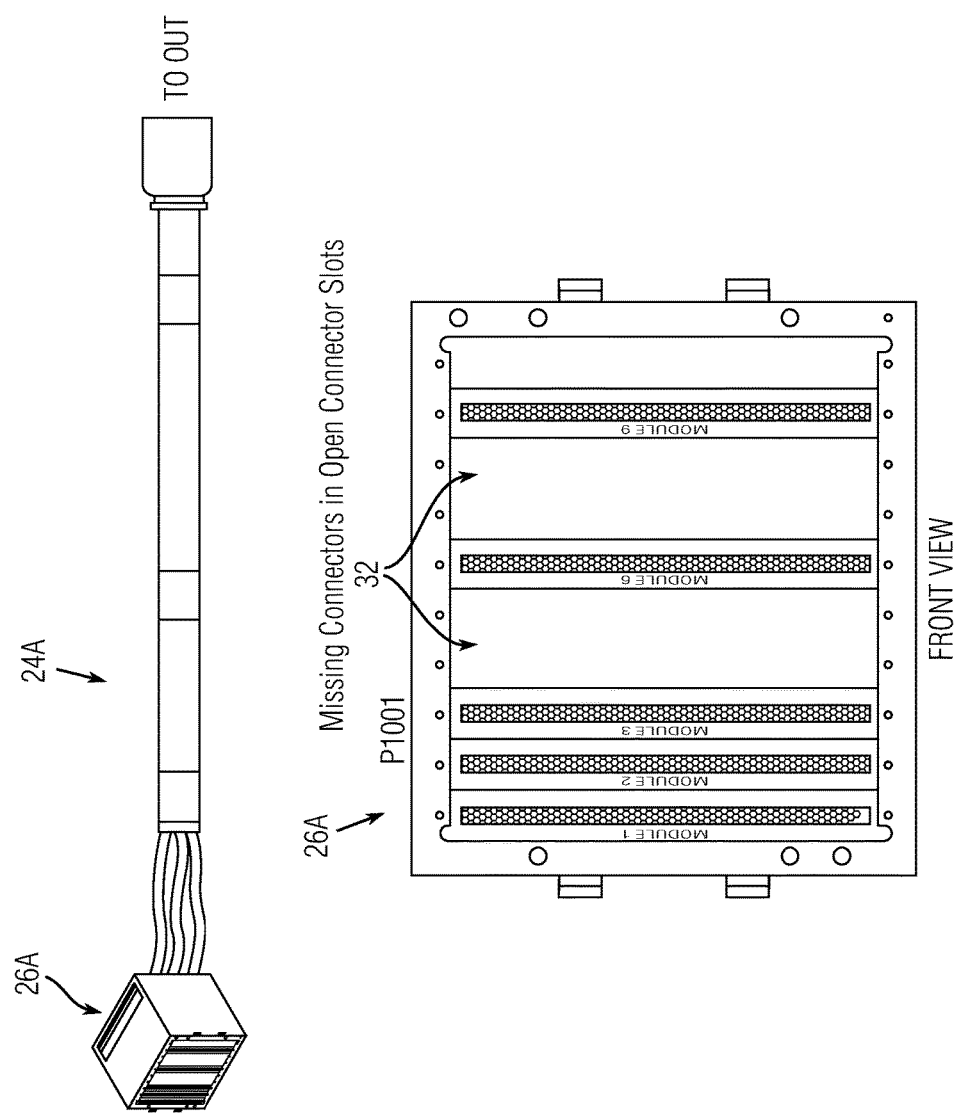
FIG. 10 shows an exemplary safety element of an exemplary embodiment of the invention including a safety interlock cable assembly.

FIG. 10 shows an exemplary safety element of an exemplary embodiment of the invention including a safety interlock cable assembly 24A. In particular, the safety interlock cable assembly 24A includes the second common interface electrical coupler (either 26A or 26B) (in this example, 26A) shown with missing conductors in open connector slots 32. These open connector slots would be where electrical connectors would otherwise be inserted that would couple with sensitive, dangerous, vulnerable, or expendable installed equipment item(s) power or actuation signal bus elements. An opposing end of the safety interlock cable assembly 24A has another electrical interface connector or coupler which connects to the system or unit under test (SUT/UUT) 25.

Figure 11:
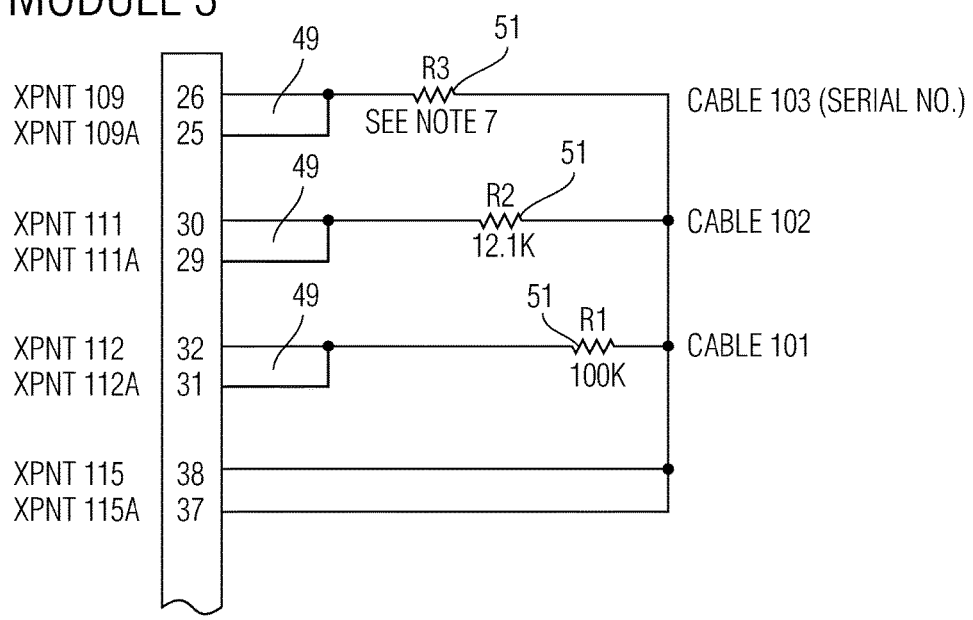
FIG. 11 shows an electrical schematic simplified detail view of one module of the FIG. 10 embodiment.

FIG. 11 shows an electrical schematic simplified detail view of one module of the FIG. 10 embodiment where an electrical connection structure needs to be inserted as contrasted to an embodiment where the electrical connector or circuit is removed such as shown in FIG. 10 open slots 32. In particular, loop back resistors 51 can be used as part of the CETSIS to assist the ETS 1 software 7 (or an equivalent control system implemented in hardware or a field programmable gate array (FPGA)) and measurement system 14 in identification of the type of cable 24 (e.g., 24A vs 24B) that is used to connect to a particular system under test 25. These loop back resistors 51 connect to the second common interface electrical coupler (26A or 26B). Should the exemplary ETS 1 detect an absence of these resistors 51 or different values of these resistors 51, the ETS 1 will halt testing to prevent inadvertent damage or unwanted actuation of a sensitive or dangerous system under test components. A loop back circuit 49 can also be used which couples two lines together so that an electrical measurement system will detect itself. Embodiments can include just the resistors 51, just the loop back circuits 49, or a combination of both resistors 51 and loop back circuit 49.

Embodiments can also include software or control sections which prompt a user to verify one or more safety systems are in place or use, such as for example a safety interlock cable assembly 24A, prior to allowing the test system to continue initialization or sending any signals to a system or unit under test or other test system components. Such an embodiment can also include a user interface section which requires validation or verification that such safety systems are in place such as input of a code or information attached or marked on such safety systems into the user interface which is then checked against a stored table of data or codes corresponding to a particular test system component (e.g., safety interlock cable 24A). Where such validation code are compared with stored data and confirmed as a match, the system can then allow test operations or sequences to be performed on such a unit or system under test.

Although the invention has been described in detail with reference to certain preferred embodiments, variations and modifications exist within the spirit and scope of the invention as described and defined in the following claims.

The invention claimed is:

1. A test system comprising:
    a test control computer comprising a processor, a memory, a test control computer input/output section, and a non-transitory machine readable storage medium storing a plurality of non-transitory test control software instructions or control sections configured to control said test system;
    a test set chassis and a common motherboard with a bus system coupled with said test control computer input/output section, wherein said common motherboard further comprising a plurality of circuit card insertion bus slots coupled to said common motherboard's bus system, said test set chassis further comprises a common ordinance ground connection or interface that each of said plurality of circuit card insertion bus slot ground pins connect with such that the system under test is not inadvertently energized or activated by power surges;
    a plurality of number of relay card assemblies inserted into the circuit card insertion bus slots, wherein each said relay card assemblies comprises:
    a programmable relay matrix and a field programmable gate array (FPGA), wherein said FPGA is connected or coupled with a card insertion bus interface of a respective relay card which in turn electrically couples with said common motherboard bus system through respective said circuit card insertion bus slots,
    a programmable relay matrix (PRM) coupled with said FPGA, said PRM further configured with programmable first inputs and programmable first outputs respectively comprising reprogrammable PRM inputs and outputs, said PRM inputs and outputs are selectively configured by said FPGA based on instructions from said non-transitory test control software instructions or control sections to couple one or more said first inputs with one or more said first outputs of the PRM, wherein said PRM ground connections to the system under test are coupled by the PRM to the common ordinance ground through the common ordnance ground connection or interface such that the system under test is not inadvertently energized or activated by power surges from a power supply connected to the test system;
    one or more connection ports, wherein said one or more connection ports on each relay card assembly are configured to couple with either the unit under test or to a test instrument, wherein said one or more test connection ports are also coupled with either said PRM input or said PRM output;
    a plurality of secondary bus segments that reconfigurably create one or more additional bus or signal connections that passes between at least one of said relay card assemblies and also connects with at least one said PRM input or output so that one or more single wire segments in the plurality of secondary bus segments can be configured to create one or more additional programmable electrical paths using at least one said PRM between at least one said test instrument connected to one said relay card assembly and at least one said unit under test connected to another relay card assembly including connections through other said relay card assemblies and said secondary bus segments; and
    one or more safety interlock interface cables configured with an electrical coupler or connector that each couples respectively with one of said one or more relay circuit card assembly connection ports, wherein at least one electrical couplers or connectors are formed with at least one safety structure or system comprising a first, second, or third safety structure, wherein said first safety structure comprises one or more of said electrical couplers or connectors formed without one or more electrical interface pins or sections that thereby isolates one or more bus or signal lines in said one or more connection ports from corresponding cable bus or signal lines in said one or more safety interlock interface cables, said second safety structure or system comprises a signal loop back structure which couples at least one of said safety interlock interface cable bus or signal lines with itself, third safety structure or system comprising a resistor disposed in series with at least one of said cable bus or signal lines in said safety interlock cable that connects with a predetermined equipment item in the unit under test;
    wherein said plurality of non-transitory test control software instructions or control sections configured to control said test system further comprise instructions or control sections which check if one safety structure(s) or system(s) are present in at least one of said one or more safety interlock interface cables on one or more predetermined and stored said cable bus or signal lines associated with one or more predefined risk conditions associated with at least one said equipment item in said unit under test, wherein if at least one of said safety structures are not detected on said predetermined or stored said cable bus or signal lines associated with one or more said predefined risk conditions, then said test system will halt further testing and output a warning indication on a display or other output device.

2. A system as in claim 1, wherein said circuit card insertion bus slots comprise a PXI bus with card slots.

3. A system as in claim 1, further comprising an accessory board, wherein at least one said secondary bus segments are also used to connect at least one said relay card assembly which are in turn programmably connected with said accessory board which is in turn connected with at least one said test instrument.

4. A system as in claim 1, wherein said secondary bus segments can be formed using segments of ribbon cables used to respectively daisy chain connected between said plurality of relay card assemblies and said PRMs.

5. A method of operating a test system comprising: providing a test system, the test system comprising:
    a test control computer comprising a processor, a memory, a test control computer input/output section, and a non-transitory machine readable storage medium storing a plurality of non-transitory test control software instructions or control sections configured to control said test system;
    a test set chassis and a common motherboard with a bus system coupled with said test control computer input/output section, wherein said common motherboard further comprising a plurality of circuit card insertion bus slots coupled to said common motherboard's bus system, said test set chassis further comprises a common ordinance ground connection or interface that each of said plurality of circuit card insertion bus slot ground pins connect with such that the system under test is not inadvertently energized or activated by power surges;

a plurality of number of relay card assemblies inserted into the circuit card insertion bus slots, wherein each said card relay assemblies comprises:

a programmable relay matrix and a field programmable gate array (FPGA), wherein said FPGA is connected or coupled with a card insertion bus interface of a respective relay card which in turn electrically couples with said common motherboard bus system through respective said circuit card insertion bus slots, a programmable relay matrix (PRM) coupled with said FPGA, said PRM further configured with programmable first inputs and programmable first outputs respectively comprising reprogrammable PRM inputs and outputs, said PRM inputs and outputs are selectively configured by said FPGA based on instructions from said non-transitory test control software instructions or control sections to couple one or more said programmable first inputs with one or more said programmable first outputs of the PRM, wherein said PRM ground connections to the system under test are coupled by the PRM to the common ordinance ground through the common ordnance ground connection or interface such that the system under test is not inadvertently energized or activated by power surges from a power supply connected to the test system;

one or more connection ports, wherein said one or more connection ports on each relay card assembly are configured to couple with either the unit under test or to one or more test instruments, wherein said one or more test connection ports are also coupled with either said PRM input or said PRM output;

a plurality of secondary bus segments are used to reconfigurably create another bus that passes between the relay card assemblies and individually also connects with each PRM input or output so that one or more single wire segments in the plurality of secondary bus segments can be configured to create a programmable electrical path using the PRM between at least one said test instrument connected to one said relay card assembly and at least one said unit under test connected to another relay card assembly including connections through other said relay card assemblies and said secondary bus segments; and one or more safety interlock interface cables configured with an electrical coupler or connector that each couples respectively with one of said one or more relay circuit card assembly connection ports, wherein at least one of said electrical couplers or connectors are formed with at least one safety structure or system comprising a first, second, or third safety structure, wherein said first safety structure comprises one or more of said electrical couplers or connectors formed without one or more electrical interface pins or sections that thereby isolates one or more cable bus or signal lines in said one or more connection ports from corresponding cable bus or signal lines in said one or more safety interlock interface cables, said second safety structure or system comprises a signal loop back structure which couples at least one of said safety interlock interface cable bus or signal lines with itself, third safety structure or system comprising a resistor disposed in series with at least one of said cable bus or signal lines in said safety interlock cable that connects with a predetermined equipment item in the unit under test;

wherein said plurality of non-transitory test control software instructions or control sections configured to control said test system further comprise instructions or control sections which check if one of said safety structures or systems are present in at least one of said one or more safety interlock interface cables on one or more predetermined and stored said cable bus or signal lines associated with one or more predefined risk conditions associated with at least one said equipment item in said unit under test, wherein if at least one of said safety structures are not detected on said predetermined or stored said cable bus or signal lines associated with one or more said predefined risk conditions, then said test system will halt further testing and output a warning indication on a display or other output device;

coupling said test system with said system under test using at least one said safety interlock interface cables;

operating said test control computer to detect if one of said safety structures or systems are present in at least one of said one or more safety interlock interface cables on one or more predetermined and stored said cable bus or signal lines associated with one or more predefined risk conditions associated with at least one said equipment item in said unit under test, wherein if at least one of said safety structures are not detected on said predetermined or stored said cable bus or signal lines associated with one or more said predefined risk conditions, then said test system halts further testing and output a warning indication on a display or other output device, wherein if said one or more safety structures or systems are detected then said testing system continues with said testing including operating said test instruments to perform a sequence of automated testing loaded by a stored program or by a user.

6. A method as in claim 5, wherein said circuit card insertion bus slots comprise a PXI bus with card slots.

7. A method as in claim 5, further comprising an accessory board, wherein at least one said secondary bus segments are also used to connect at least one said relay card assembly which are in turn programmably connected with said accessory board which is in turn connected with at least one said test instrument.

8. A method as in claim 5, wherein said secondary bus segments can be formed using segments of ribbon cables used to respectively daisy chain connected between said sets of relay card assemblies and said PRMs.

9. A test system comprising:

a computer comprising a plurality of control sections adapted to operate said test system;

an electrical chassis system comprising a plurality of circuit board insertion slots electrically coupled with and controlled by said computer;

one or more test measurement systems adapted to generate test signals or perform test measurements on a system under test comprising at least one explosive, deflagrator, combustible, electrical or mechanical elements or structures;

a plurality of programmable relay circuit cards each respectively coupled with one of said plurality of circuit board insertion slots, each of said programmable relay circuit cards formed with a first electrical signal bus interface connector comprising a first plurality of signal or bus lines sections that are each programmably and respectively coupled with one or more second plurality of signal or bus lines sections connected to said one or more said test measurement systems and said computer, wherein said electrical chassis system further comprises a common ordinance ground connection or interface that each of said plurality of programmable relay circuit cards insertion slot ground pins connect with such that a system under test is not inadvertently energized or activated by power surges from a power supply connected to said test system;

a plurality of test instruments coupled to one or more of said plurality of programmable relay circuit cards; and one or more safety interlock cables configured with a second electrical signal bus interface connector that each couples respectively with one of said one or more relay circuit card assembly connection ports, wherein at least one of said second electrical couplers or connectors are formed with at least one safety structure or system comprising a first, second, or third safety structure, wherein said first safety structure comprises one or more of said electrical couplers or connectors formed without one or more electrical interface pins or sections that thereby isolates one or more second plurality of bus or signal line sections in said one or more connection ports from one or more corresponding third plurality of bus or signal line sections in said one or more safety interlock interface cables, said second safety structure or system comprises a signal loop back structure which couples at least one of said third plurality of bus or signal lines in said safety interlock interface cable with themselves, said third safety structure or system comprising a resistor disposed in series with at least one of said third plurality of bus or signal line sections in said safety interlock cable that connects with at least one said explosive, deflagrator, combustible, electrical or mechanical elements or structures.

10. A test system as in claim 9, wherein at least one of said plurality of programmable relay circuit cards comprises a programmable relay matrix and a field programmable gate array (FPGA), wherein said FPGA is electrically connected or coupled with said plurality of circuit board insertion slots which are in turn electrically coupled with said electrical chassis system.

11. A test system as in claim 10, wherein said programmable relay circuit cards further comprise a programmable relay matrix (PRM) coupled with said FPGA, said PRM is further configured with programmable first inputs and programmable first outputs respectively comprising reprogrammable PRM inputs and outputs, said PRM inputs and outputs are selectively configured by said FPGA based on instructions from said computer to couple one or more said programmable first inputs with one or more said programmable first outputs of the PRM, wherein said programmable relay circuit cards further comprise one or more connection ports, wherein said one or more connection ports on each relay card assembly are configured to couple with either the unit under test or to one or more said test instruments, wherein said one or more test connection ports are also coupled with either said PRM input or said PRM output.

12. A test system as in claim 11, wherein said programmable relay circuit cards further comprise a plurality of secondary bus segments that reconfigurably create one or more additional bus or signal connections that passes between at least one of said programmable relay circuit cards and individually also connects with at least one said PRM input or output so that one or more single wire segments in the plurality of secondary bus segments can be configured to create one or more additional programmable electrical paths using at least one said PRM between at least one said test instrument connected to one said programmable relay circuit cards and at least one said unit under test connected to at least one another one of said programmable relay circuit cards including connections through at least one other said programmable relay circuit cards and said secondary bus segments.

* * * * *